(12) United States Patent
Chen

(10) Patent No.: US 11,146,192 B2
(45) Date of Patent: Oct. 12, 2021

(54) FAULT HANDLING METHOD AND APPARATUS FOR WIND POWER GENERATOR SET, AND COMPUTER READABLE STORAGE MEDIUM

(71) Applicant: BEIJING GOLDWIND SCIENCE & CREATION WINDPOWER EQUIPMENT CO., LTD., Beijing (CN)

(72) Inventor: Yong Chen, Beijing (CN)

(73) Assignee: BEIJING GOLDWIND SCIENCE & CREATION WINDPOWER EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/765,020

(22) PCT Filed: Jan. 17, 2019

(86) PCT No.: PCT/CN2019/072208
§ 371 (c)(1),
(2) Date: May 18, 2020

(87) PCT Pub. No.: WO2019/223350
PCT Pub. Date: Nov. 28, 2019

(65) Prior Publication Data
US 2020/0366225 A1 Nov. 19, 2020

(30) Foreign Application Priority Data

May 25, 2018 (CN) .......................... 201810513101.7
May 25, 2018 (CN) .......................... 201810560696.1

(51) Int. Cl.
*H02P 9/00* (2006.01)
*F03D 7/02* (2006.01)
(Continued)

(52) U.S. Cl.
CPC ............ *H02P 9/006* (2013.01); *F03D 7/0264* (2013.01); *F03D 7/042* (2013.01); *G01K 7/015* (2013.01); *G01K 13/00* (2013.01)

(58) Field of Classification Search
CPC ........ H02P 9/006; H02P 29/68; F03D 7/0264; F03D 7/042; G01K 7/015; G01K 13/00
See application file for complete search history.

(56) References Cited

U.S. PATENT DOCUMENTS

2011/0054825 A1* 3/2011 Perla ....................... F03D 17/00
                                                                    702/113
2012/0211984 A1 8/2012 Liu et al.
2014/0246855 A1 9/2014 Vasak et al.

FOREIGN PATENT DOCUMENTS

CN        102644545 A      8/2012
CN        203879690 U      10/2014
(Continued)

OTHER PUBLICATIONS

International Search Report dated Apr. 18, 2019; PCT/CN2019/072208.
(Continued)

*Primary Examiner* — Viet P Nguyen

(57) ABSTRACT

A fault handling method and apparatus for a wind power generator set, and a computer readable storage medium. The fault handling method comprises: dividing faults of a wind power generator set into groups according to a target protection object, each group of faults including a plurality of process faults associated with the target protection object and a target fault of the target protection object (101); if any one of the plurality of process faults in the same group as the target fault satisfies a corresponding process fault trigger condition and the target fault does not satisfy the corresponding target fault trigger condition, performing a fault-tolerant operation on the wind power generator set (102); if (Continued)

the target fault satisfies the corresponding target fault trigger condition, selecting, from the triggered process faults in the same group as the target fault, the process fault having the highest degree of association as a real fault that has caused shut-down of the wind power generator set (202). Thus, the invention can improve the reliability of a fault protection mechanism for a wind power generator set, and improve the accuracy of fault identification for a wind power generator set.

15 Claims, 7 Drawing Sheets

(51) Int. Cl.
*F03D 7/04* (2006.01)
*G01K 7/01* (2006.01)
*G01K 13/00* (2021.01)

(56) References Cited

FOREIGN PATENT DOCUMENTS

| | | |
|---|---|---|
| CN | 105508149 A | 4/2016 |
| CN | 106021036 A | 10/2016 |
| CN | 107701378 A | 2/2018 |
| CN | 108845242 A | 11/2018 |
| CN | 108900125 A | 11/2018 |
| EP | 2609326 | 7/2013 |
| WO | 2012/025121 A2 | 3/2012 |

OTHER PUBLICATIONS

A.S. Zaher et al.; "A Multi-Agent Fault Detection System for Wind Turbine Defect Recognition and Diagnosis", 2007 IEEE Lausanne Power Tech, Jul. 1-5, 2007, 6 pages.

The First Chinese Office Action dated May 30, 2019; Appln. No. 201810560696.1.

European Search Report dated Jan. 28, 2021; Appln. No. 19807684.6.

* cited by examiner

FAULT HANDLING METHOD AND APPARATUS FOR WIND POWER GENERATOR SET, AND COMPUTER READABLE STORAGE MEDIUM

The present application is the US national phase of International Application No. PCT/CN2019/072208 filed on Jan. 17, 2019, which claims priority to Chinese Patent Application No. 201810513101.7, titled "FAULT TOLERANCE METHOD AND DEVICE, AND COMPUTER-READABLE STORAGE MEDIUM", filed with the China National Intellectual Property Administration on May 25, 2018, and Chinese Patent Application No. 201810560696.1, titled "FAULT IDENTIFICATION METHOD AND DEVICE, AND COMPUTER-READABLE STORAGE MEDIUM", filed with the China National Intellectual Property Administration on May 25, 2018, the disclosures of which are incorporated herein by reference in their entirety.

FIELD

The present disclosure relates to the technical field of wind power generation, and in particular to a fault processing method and device for a wind turbine, and a computer-readable storage medium.

BACKGROUND

A common fault protection policy for a wind turbine is a single-aspect fault protection method, in which a monitoring signal of the wind turbine is compared with a protection boundary and in a case that the monitoring signal exceeds the protection boundary, a master controller of the wind turbine is notified to perform the shutdown protection operation.

In order to enable the wind turbine to maintain power generation operation in the case of unnecessary shutdown, the fault tolerance processing is performed on the wind turbine mainly by expanding the protection boundary in the conventional technology. However, improper expansion of the protection boundary may result in improper fault tolerance processing. In addition, tendency of fault occurrence may be suppressed by changing the execution policy of the controller, which, however, may affect performance of the wind turbine.

In view of the above, it is desired to provide a new fault processing method for a wind turbine, to improve reliability of a fault protection mechanism for the wind turbine.

SUMMARY

There are provided a fault processing method and device for a wind turbine, and a computer-readable storage medium according to embodiments of the present disclosure, which can improve reliability of a fault protection mechanism for the wind turbine.

In a first aspect, a fault processing method for a wind turbine is provided according to an embodiment of the present disclosure. The fault processing method for a wind turbine includes:

grouping faults of the wind turbine based on a target protection object, where each group of faults include multiple process faults associated with the target protection object and a target fault of the target protection object;

performing a fault tolerance control on the wind turbine, in a case that any one of the multiple process faults in the same group as the target fault reaches a corresponding process fault trigger condition and the target fault does not reach a corresponding target fault trigger condition; and selecting, in a case that the target fault reaches the corresponding target fault trigger condition, a process fault with the highest degree of correlation from triggered process faults in the same group as the target fault, as a real fault resulting in shutdown of the wind turbine.

In a second aspect, a fault processing device for a wind turbine is provided according to an embodiment of the present disclosure, which includes: a grouping module, a fault tolerance module and an identification module.

The grouping module is configured to group faults of the wind turbine based on a target protection object, where each group of faults include multiple process faults associated with the target protection object and a target fault of the target protection object.

The fault tolerance module is configured to perform a fault tolerance control on the wind turbine, in a case that any one of the multiple process faults in the same group as the target fault reaches a corresponding process fault trigger condition and the target fault does not reach a corresponding target fault trigger condition.

The identification module is configured to select, in a case that the target fault reaches the corresponding target fault trigger condition, a process fault with the highest degree of correlation from triggered process faults in the same group as the target fault, as a real fault resulting in shutdown of the wind turbine.

In a third aspect, a fault processing device for a wind turbine is provided according to an embodiment of the present disclosure. The fault processing device includes a memory, a processor, and a program stored in the memory and executable on the processor. When executed by the processor, the program causes the processor to implement the fault processing method for a wind turbine described above.

In a fourth aspect, a computer-readable storage medium having stored thereon a program is provided according to an embodiment of the present disclosure. When executed by a processor, the program causes the processor to implement the fault processing method for a wind turbine described above.

As described above, in order to perform the fault tolerance control on the wind turbine, the faults of the wind turbine may be first grouped based on the target protection object, so that each group of faults include multiple process faults associated with the target protection object and a target fault of the target protection object. Further, the condition for performing the fault tolerance control on the wind turbine in the embodiments of the present disclosure is that any one of the multiple process faults in the same group as the target fault reaches the corresponding process fault trigger condition and the target fault does not reach the corresponding target fault trigger condition.

The process fault can indicate the operation status of a subsystem, and the target fault can indicate the operation status of the overall system. Therefore, compared with the technical solution in the conventional technology that the fault tolerance control on the wind turbine is performed by expanding a protection boundary, the impact of the fault of each subsystem on the overall system can be incorporated into the fault tolerance policy in the embodiments of the present disclosure, thereby improving the reliability of the fault protection mechanism for the wind turbine.

Further, in order to locate the real fault of the wind turbine, the faults of the wind turbine may be first grouped based on the target protection object, so that each group of faults include multiple process faults associated with the target protection object and a target fault of the target protection object. If the target fault reaches the corresponding target fault trigger condition, the process fault with the highest degree of correlation is selected from the triggered process faults in the same group as the target fault, as the real fault resulting in the shutdown of the wind turbine.

In the embodiments of the present disclosure, the fault resulting in the shutdown of the wind turbine is defined from the process fault with the highest degree of correlation selected from the triggered process faults in the same group as the target fault. Compared with the technical solution in the conventional technology that the target fault is directly used as a fault determination criterion, the real cause of the shutdown of the wind turbine can be traced in the embodiments of the present disclosure, so that fault location accuracy can be improved, thereby providing a reference for subsequent fault troubleshooting and resolving.

DETAILED DESCRIPTION OF EMBODIMENTS

Features and exemplary embodiments of various aspects of the present disclosure are described in detail below. In the following detailed description, specific details are set forth to provide a thorough understanding of the present disclosure.

A wind turbine is a huge system including multiple subsystems. In the fault tolerance method in the conventional technology, the impact of the fault of each subsystem on the overall system is not considered, resulting in low reliability of a fault protection mechanism for the wind turbine. In view of the above, there are provided a fault processing method and a fault processing device for a wind turbine, and a computer-readable storage medium according to embodiments of the present disclosure, which are applied in the technical field of wind power generation. The fault tolerance processing is performed mainly based on a degree of correlation between faults of the entire wind turbine.

The wind turbine is subject to multiple types of faults. In an example, a converter water cooling system may be construed as a subsystem of a converter system. A temperature fault of water cooling liquid may result in an increase in a temperature of a power electronic device in the converter, that is, an insulated gate bipolar transistor (IGBT for short). For example, if the temperature of the water cooling liquid is too high, heat dissipation of the IGBT becomes poor, and the temperature of the IGBT rises sharply, eventually triggering the IGBT temperature fault. By adopting the fault tolerance method according to the embodiments of the present disclosure, the impact of the fault of each subsystem on the overall system can be incorporated into the fault tolerance policy, and the reliability of the fault protection mechanism for the wind turbine can be improved.

In addition, due to the fault tolerance mechanism, the wind turbine may be diagnosed as faulty only after several fault tolerance warnings. In this case, the fault indicated by the final fault state may not be a real fault causing the wind turbine to enter the faulty state from the normal operating state. Therefore, in the embodiments of the present disclosure, the wind turbine is considered as a whole, the faults are grouped, and fault location is performed based on the grouped faults.

Figure 1:
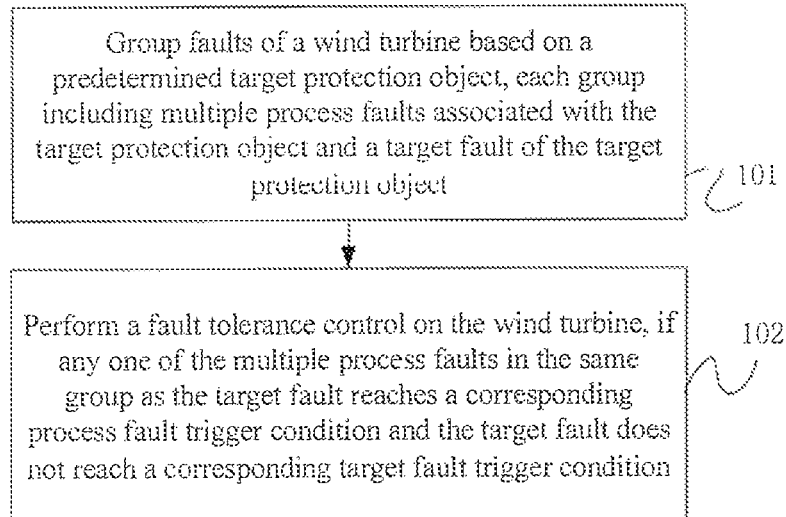
FIG. 1 is a schematic flowchart of a fault tolerance method in a fault processing method for a wind turbine according to a first embodiment of the present disclosure.

FIG. 1 is a schematic flowchart of a fault tolerance method in a fault processing method for a wind turbine according to a first embodiment of the present disclosure. As shown in FIG. 1, the fault processing method for a wind turbine includes steps 101 and 102.

In step 101, faults of the wind turbine are grouped based on a target protection object, where each group of faults include multiple process faults associated with the target protection object and a target fault of the target protection object.

The target protection object refers to a protection object closely related to safe operation of the wind turbine. In combination with the actual operation status of the wind turbine, the target protection object may be a rotational speed of the wind turbine, an IGBT temperature of the converter, and the like.

In an example, the target protection object may be the IGBT temperature of the converter, and the target fault is an IGBT temperature fault of the converter, specifically, an abnormal condition in which the IGBT temperature exceeds a predetermined temperature protection domain degree. Accordingly, a process fault associated with the IGBT temperature of the converter refers to an abnormal condition that can cause the IGBT temperature to exceed the predetermined temperature protection domain degree, for example, a temperature fault of water cooling liquid in the converter and a fan fault of water cooling radiator.

In step 102, in a case that any one of the multiple process faults in the same group as the target fault reaches a corresponding process fault trigger condition and the target fault does not reach a corresponding target fault trigger condition, a fault tolerance control is performed on the wind turbine.

The fault tolerance control refers to a control that, after a process fault is triggered, the wind turbine goes on running while a warning message is sent, and shutdown protection is not performed on the wind turbine until the target fault is triggered, rather than performing the shutdown protection on the wind turbine as long as any fault is triggered. In this way, the number of shutdowns of the wind turbine can be reduced, and availability of the wind turbine can be improved.

In the embodiment of the present disclosure, threshold information may be separately set for each target fault and multiple process faults related to the target fault. In this case, if sampling data related to the process fault meets first threshold information, the corresponding process fault trigger condition is reached, and if sampling data related to the target fault does not meet second threshold information, the corresponding target fault trigger condition is not reached.

It should be noted that, during the practical operation of the wind turbine, sampling data for a same fault may be from multiple sources. For example, rotational speed data of the wind turbine may be from an encoder mounted on a rotation shaft of a motor, a pulse counter mounted on a turntable, or a converter controller.

In this case, whether the source of the sampling data is correct may be determined based on a value of the sampling data. If two or more sources of the sampling data are correct, the sampling data from a source with a higher priority among the two or more sources is selected as the sampling data related to the corresponding fault. The priorities of the sources may be ranked based on the experience of those skilled in the art.

As described above, in order to perform the fault tolerance control on the wind turbine, the faults of the wind turbine may be first grouped based on the target protection object, so that each group of faults include multiple process faults associated with the target protection object and a target fault of the target protection object. Further, the condition for performing the fault tolerance control on the wind turbine in the embodiment of the present disclosure is that: any one of the multiple process faults in the same group as the target fault reaches the corresponding process fault trigger condition and the target fault does not reach the corresponding target fault trigger condition.

The process fault may indicate the operation status of the subsystem, and the target fault may indicate the operation status of the overall system. Therefore, compared with the technical solution in the conventional technology that the fault tolerance control on the wind turbine is performed by expanding a protection boundary, the impact of the fault of each subsystem on the overall system can be incorporated into the fault tolerance policy in the embodiment of the present disclosure, thereby improving the reliability of the fault protection mechanism for the wind turbine.

Figure 2:
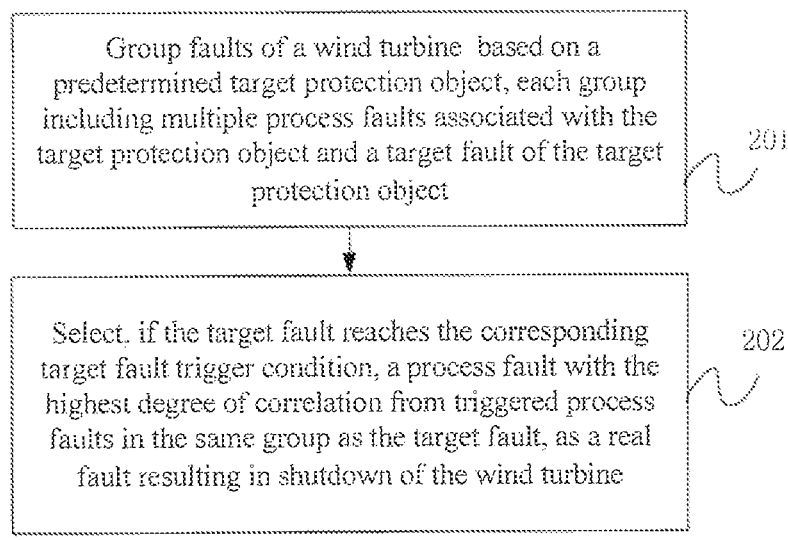
FIG. 2 is a schematic flowchart of a fault identification method in the fault processing method for a wind turbine according to the first embodiment of the present disclosure.

FIG. 2 is a schematic flowchart of a fault identification method in the fault processing method for a wind turbine according to the first embodiment of the present disclosure. As shown in FIG. 2, the fault identification method includes steps 201 and 202.

In step 201, faults of the wind turbine are grouped based on a target protection object, where each group of faults include multiple process faults associated with the target protection object and a target fault of the target protection object.

In step 202, in a case that the target fault reaches the corresponding target fault trigger condition, a process fault with the highest degree of correlation is selected from triggered process faults in the same group as the target fault, as a real fault resulting in shutdown of the wind turbine.

In an optional embodiment, the process fault with the highest degree of correlation may include a process fault with the earliest trigger timing among the triggered process faults in the same group as the target fault. Continuing with the above example, the target protection object includes the IGBT temperature of the converter, and the temperature fault of water cooling liquid in the converter and the fan fault of water cooling radiator are triggered successively. In this case, if the IGBT temperature fault of the converter of the converter is triggered, the process fault with the highest degree of correlation is the temperature fault of water cooling liquid in the converter.

In an optional embodiment, the process fault with the highest degree of correlation may include a process fault with the highest priority among the triggered process faults in the same group as the target fault, where the priority indicates a degree of impact of the process fault on the target fault. Continuing with the above example, the target protection object includes the IGBT temperature of the converter, and the temperature fault of water cooling liquid in the converter has a greater impact on the IGBT temperature than the water cooling radiator fan fault. In this case, if the IGBT temperature fault of the converter is triggered, the process fault with the highest degree of correlation is the temperature fault of water cooling liquid in the converter.

As described above, in order to locate the real fault of the wind turbine, the faults of the wind turbine may be first grouped based on the target protection object, so that each group of faults include multiple process faults associated with the target protection object and a target fault of the target protection object. If the target fault reaches the corresponding target fault trigger condition, the process fault with the highest degree of correlation is selected from the triggered process faults in the same group as the target fault, as the real fault resulting in the shutdown of the wind turbine.

In the embodiment of the present disclosure, the fault resulting in the shutdown of the wind turbine is defined from the process fault with the highest degree of correlation selected from the triggered process faults in the same group as the target fault. Compared with the technical solution in the conventional technology that the target fault is directly used as a fault determination criterion, the real cause of the shutdown of the wind turbine can be traced in the embodiment of the present disclosure, so that fault location accuracy can be improved, thereby providing a reference for subsequent fault troubleshooting and resolving.

In specific implementations, during the fault tolerance control of the wind turbine, one or more process faults may be triggered, whilst the wind turbine goes on running while the warning message is sent, and the shutdown protection is not performed on the wind turbine until the target fault is triggered. The above fault tolerance control may be defined as a passive fault tolerance control.

In the passive fault tolerance control, the protection domain degree of the target protection object is taken as the control target, whereas no adjustment or control is performed with respect to the cause of the fault. Due to the process fault, the target protection object quickly exceeds the protection domain degree, and the corresponding target fault is triggered. Therefore, in order to suppress the impact of the process fault and extend or avoid the trigger of the target fault, an active fault tolerance control is further provided according to an embodiment of the present disclosure.

Figure 3:
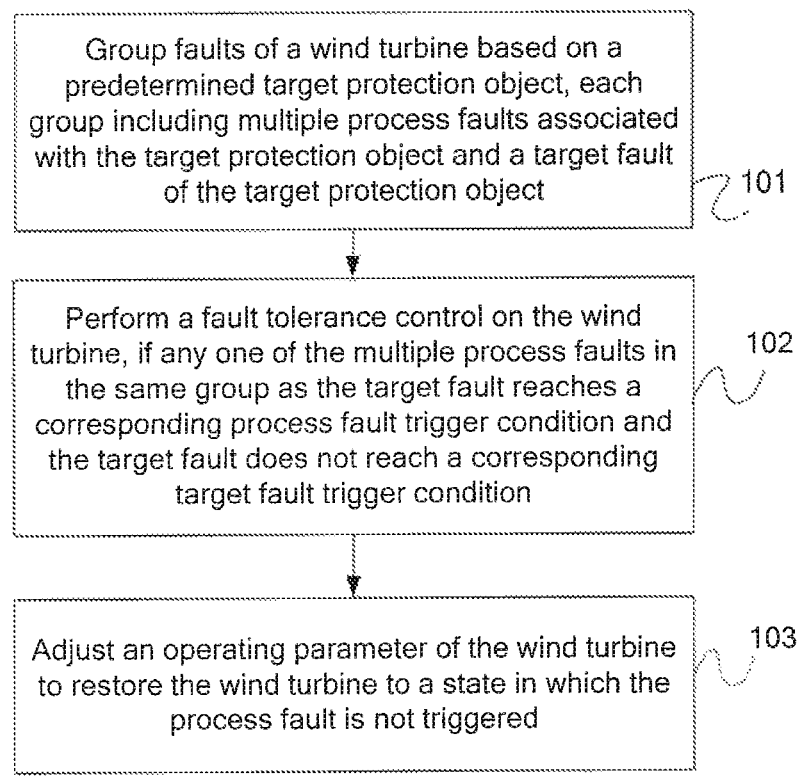
FIG. 3 is a schematic flowchart of a fault tolerance method in a fault processing method for a wind turbine according to a second embodiment of the present disclosure.

FIG. 3 is a schematic flowchart of a fault tolerance method in a fault processing method for a wind turbine according to a third embodiment of the present disclosure. FIG. 3 differs from FIG. 1 in that the method shown in FIG. 3 further includes step 103, to describe the active fault tolerance control in detail.

In step 103, an operating parameter of the wind turbine is adjusted to restore the wind turbine to a state in which the process fault is not triggered.

In order to facilitate the understanding by those skilled in the art, the specific implementation of step 103 is described in detail by taking the case that the target protection object is the IGBT temperature and a process fault associated with the IGBT temperature is that a water cooling temperature of the converter exceeds a preset threshold as an example.

It is assumed that, the temperature fault of water cooling liquid in the converter has been triggered, and the IGBT temperature has not reached the fault value. In this case, an alarm may be first issued to report the fault of the water cooling liquid temperature being high, and then the fault tolerance control is performed on the wind turbine with the IGBT temperature as a control target.

In addition, in order to suppress continuous rising of the water cooling liquid temperature, output power of the wind turbine or the number of windings engaged in operation of the converter may be reduced, to restore the water cooling temperature of the converter to a temperature lower than the preset threshold, so that the wind turbine g is restored to normal operation.

In an optional embodiment, if the target fault reaches the corresponding target fault trigger condition, the wind turbine is controlled to be shut down.

Due to the fault tolerance control, the wind turbine may be diagnosed as faulty only after several fault tolerance warnings. In this case, the fault indicated by the final fault state may not be a real fault causing the wind turbine to enter the faulty state from the normal operating state. Exemplarily, in order to accurately locate the cause of the wind turbine entering the faulty state from the normal operating state, the process fault with the highest degree of correlation may be selected from the triggered process faults in the same group as the target fault, as the real fault resulting in the shutdown of the wind turbine, which provides a reference for subsequent fault troubleshooting and resolving.

Figure 4:
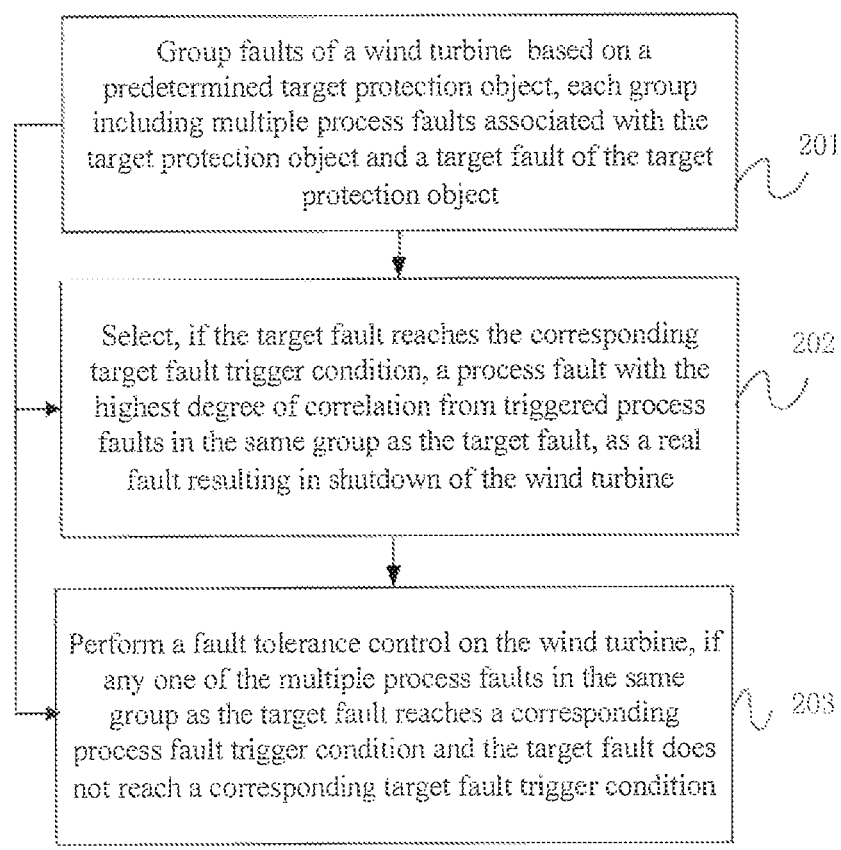
FIG. 4 is a schematic flowchart of a fault identification method in the fault processing method for a wind turbine according to the second embodiment of the present disclosure.

FIG. 4 is a schematic flowchart of a fault identification method in the fault processing method for a wind turbine according to the second embodiment of the present disclosure. FIG. 4 differs from FIG. 2 in that, the method shown in FIG. 4 further includes step 203 after step 201 in FIG. 2, to describe the fault tolerance control based on the grouped faults of the wind turbine in detail.

In step 203, in a case that any one of the multiple process faults in the same group as the target fault reaches the corresponding process fault trigger condition and the target fault does not reach the corresponding target fault trigger condition, a fault tolerance control is performed on the wind turbine.

The process fault may indicate the operation status of the subsystem, and the target fault may indicate the operation status of the overall system. Therefore, compared with the technical solution in the conventional technology that the fault tolerance control on the wind turbine is performed by expanding a protection boundary, the impact of the fault of each subsystem on the overall system can be incorporated into the fault tolerance policy in the embodiment of the present disclosure, thereby improving the reliability of the fault protection mechanism for the wind turbine.

Figure 5:
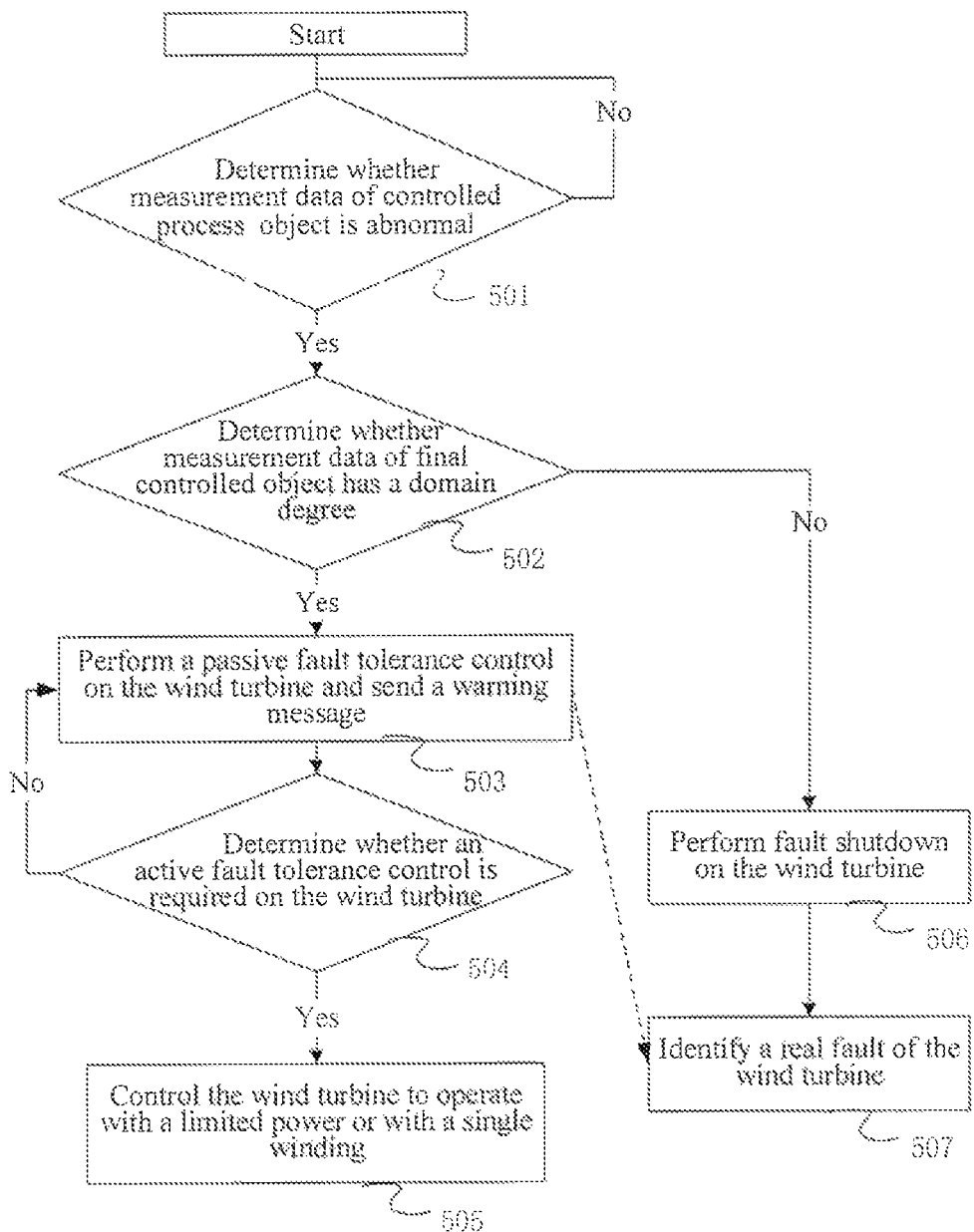
FIG. 5 is a schematic flowchart of a fault tolerance method in a fault processing method for a wind turbine according to a third embodiment of the present disclosure.

FIG. 5 is a schematic flowchart of a fault tolerance method in a fault processing method for a wind turbine according to a third embodiment of the present disclosure, to illustrate the fault processing method for a wind turbine described above in combination with an application environment. The fault processing method for a wind turbine shown in FIG. 5 includes steps 501 to 507.

It is assumed that, each final control object (i.e., the target protection object) and each controlled process object are respectively provided with corresponding sensors, to monitor the operation of the final control object and the controlled process object in a real time manner.

In step 501, it is determined whether measurement data of the controlled process object is abnormal. If the measurement data of the controlled process object is abnormal, the method proceeds to step 502; otherwise the method returns to step 501.

In step 502, it is determined whether measurement data of the final controlled object has a domain degree. If the measurement data of the final controlled object has a domain degree, the method proceeds to step 503; otherwise the method proceeds to step 506.

In step 503, a passive fault tolerance control is performed on the wind turbine, and a warning message is sent. The warning message includes information indicating that a process fault is triggered.

In step 504, it is determined whether an active fault tolerance control is required on the wind turbine. If the active fault tolerance control is required on the wind turbine, the method proceeds to step 505; otherwise the method returns to step 503.

In step 505, the wind turbine is controlled to operate with a limited power or with a single winding.

In step 506, fault shutdown is performed on the wind turbine.

In step 507, a real fault of the wind turbine is identified in conjunction with the warning message in step 503.

As described above, in the embodiment of the present disclosure, with reference to the system level protection domain degree, the degree of impact of the process fault can be minimized, thereby significantly reducing the fault occurrence frequency of the wind turbine, and improving the reliability and power generation of the wind turbine.

Figure 6:
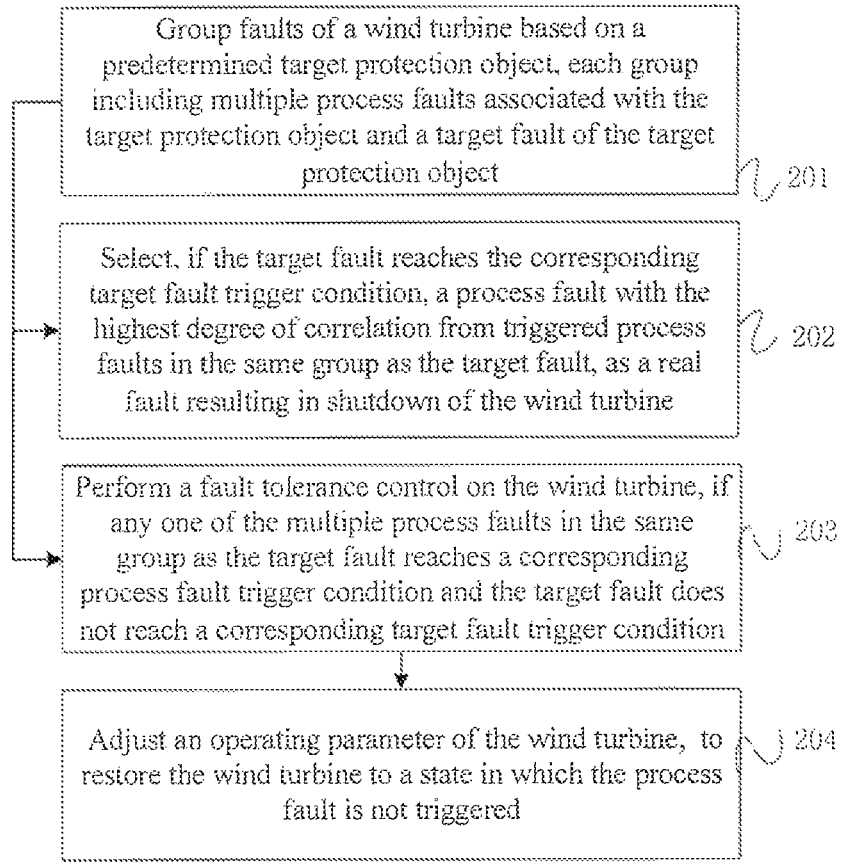
FIG. 6 is a schematic flowchart of a fault identification method in the fault processing method for a wind turbine according to the third embodiment of the present disclosure.

FIG. 6 is a schematic flowchart of a fault identification method in the fault processing method for a wind turbine according to the third embodiment of the present disclosure. FIG. 6 differs from FIG. 4 in that, the method shown in FIG. 6 further includes step 204 after step 203 in FIG. 4, to describe the active fault tolerance control in detail.

In step 204, an operating parameter of the wind turbine is adjusted to restore the wind turbine to a state in which the process fault is not triggered.

The following description is given by taking the case that the target protection object is the IGBT temperature and a process fault associated with the IGBT temperature is that a water cooling temperature of the converter exceeds a preset threshold as an example. It is assumed that, the temperature fault of water cooling liquid in the converter has been triggered, and the IGBT temperature has not reached the fault value. In this case, an alarm may be first issued to report the fault of the water cooling liquid temperature being high, and then the fault tolerance control is performed on the wind turbine with the IGBT temperature as a control target.

In addition, in order to suppress continuous rising of the water cooling liquid temperature, output power of the wind turbine or the number of windings engaged in operation of the converter may be reduced, to restore the water cooling temperature of the converter to a temperature lower than the preset threshold, so that the wind turbine is restored to normal operation.

Figure 7:
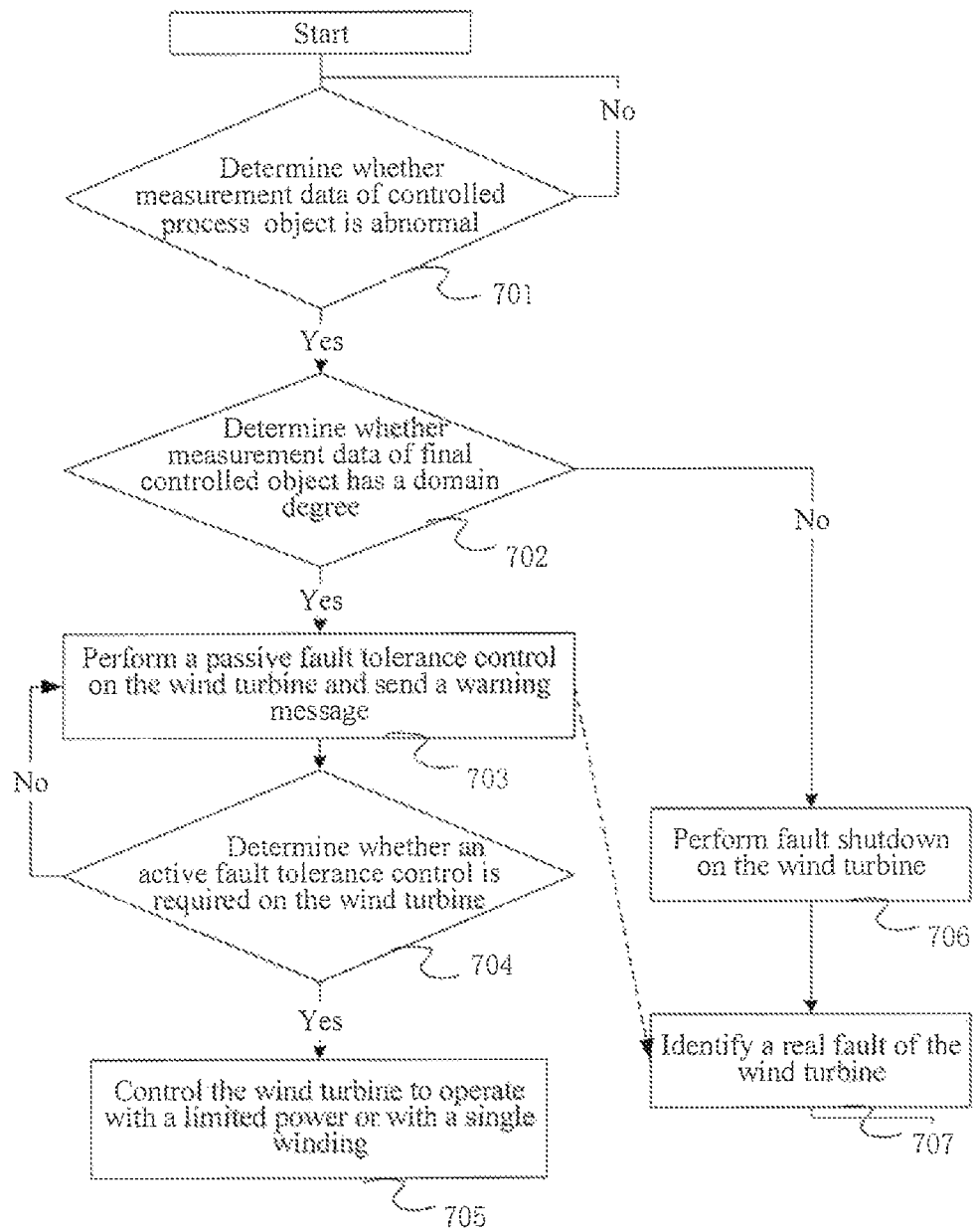
FIG. 7 is a schematic flowchart of a fault identification method in a fault processing method for a wind turbine according to a fourth embodiment of the present disclosure.

FIG. 7 is a schematic flowchart of a fault identification method in a fault processing method for a wind turbine according to a fourth embodiment of the present disclosure, to illustrate the fault identification method in combination with an application environment. The fault identification method shown in FIG. 7 includes steps 701 to 707.

It is assumed that, each final control object (i.e., the target protection object) and each controlled process object are respectively provided with corresponding sensors, to monitor the operation of the final control object and the controlled process object in a real time manner.

In step 701, it is determined whether measurement data of the controlled process object is abnormal. If the measurement data of the controlled process object is abnormal, the method proceeds to step 702; otherwise the method returns to step 701.

In step 702, it is determined whether measurement data of the final controlled object has a domain degree. If the measurement data of the final controlled object has a domain degree, the method proceeds to step 703; otherwise the method proceeds to step 506.

In step 703, a passive fault tolerance control is performed on the wind turbine, and a warning message is sent. The warning message includes information indicating that a process fault is triggered.

In step 704, it is determined whether an active fault tolerance control is required on the wind turbine. If the active fault tolerance control is required on the wind turbine, the method proceeds to step 705; otherwise the method returns to step 703.

In step 705, the wind turbine is controlled to operate with a limited power or with a single winding.

In step 706, fault shutdown is performed on the wind turbine.

In step 707, a real fault of the wind turbine is identified in conjunction with the warning message in step 703.

As described above, in the embodiment of the present disclosure, with reference to the system level protection domain degree, the degree of impact of the process fault can be minimized by the active fault tolerance control, thereby significantly reducing the fault occurrence frequency of the wind turbine, and improving the reliability and power generation of the wind turbine. Further, the real fault of the wind turbine is identified in conjunction with the warning message for the process fault, which provides a reference for subsequent fault troubleshooting and resolving and has a good popularization.

Figure 8:
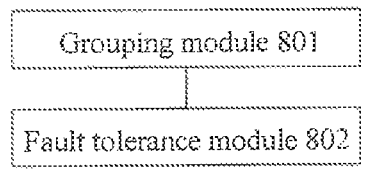
FIG. 8 is a schematic structural diagram of a fault tolerance device in a fault processing device for a wind turbine according to a fifth embodiment of the present disclosure.

FIG. 8 is a schematic structural diagram of a fault tolerance device in a fault processing device for a wind turbine according to a fifth embodiment of the present disclosure. As shown in FIG. 8, the fault tolerance device includes a grouping module 801 and a fault tolerance module 802.

The grouping module 801 is configured to group faults of the wind turbine based on a target protection object, where each group of faults include multiple process faults associated with the target protection object and a target fault of the target protection object.

The fault tolerance module 802 is configured to: perform a fault tolerance control on the wind turbine, in a case that any one of the multiple process faults in the same group as the target fault reaches a corresponding process fault trigger condition and the target fault does not reach a corresponding target fault trigger condition.

Figure 9:
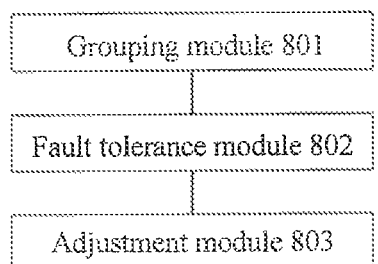
FIG. 9 is a schematic structural diagram of a fault tolerance device in a fault processing device for a wind turbine according to a sixth embodiment of the present disclosure.

FIG. 9 is a schematic structural diagram of a fault tolerance device in a fault processing device for a wind turbine according to a sixth embodiment of the present disclosure. FIG. 9 differs from FIG. 8 in that the fault tolerance device shown in FIG. 9 further includes an adjustment module 803. The adjustment module 803 is configured to: adjust an operating parameter of the wind turbine to restore the wind turbine to a state in which the process fault is not triggered.

In an optional embodiment, the fault processing device for a wind turbine described above may be a standalone device having a logic operation function. In order to avoid modification of the existing hardware structure, the fault processing device for a wind turbine may be arranged in a master controller or a converter controller of the wind turbine.

Figure 10:
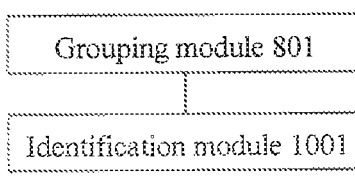
FIG. 10 is a schematic structural diagram of a fault identification device in the fault processing device for a wind turbine according to the fifth embodiment of the present disclosure.

FIG. 10 is a schematic structural diagram of a fault identification device in the fault processing device for a wind turbine according to the fifth embodiment of the present disclosure. As shown in FIG. 10, the fault identification device includes a grouping module 801 and an identification module 1001.

The grouping module 801 is configured to group faults of the wind turbine based on a target protection object, where each group of faults include multiple process faults associated with the target protection object and a target fault of the target protection object.

The identification module 1001 is configured to: in a case that the target fault reaches the corresponding target fault trigger condition, select a process fault with the highest degree of correlation from the triggered process faults in the same group as the target fault, as a real fault resulting in shutdown of the wind turbine.

In an optional embodiment, the process fault with the highest degree of correlation includes a process fault with the earliest trigger timing among the triggered process faults in the same group as the target fault.

In an optional embodiment, the process fault with the highest degree of correlation includes a process fault with the highest priority among the triggered process faults in the same group as the target fault, where the priority indicates a degree of impact of the process fault on the target fault.

Those skilled in the art may determine the type of the process fault with the highest degree of correlation in combination with the actual operation of the wind turbine, which is not limited herein.

In an optional embodiment, the fault identification device described above may be a standalone device having a logic operation function. In order to avoid modification of the existing hardware structure, the fault identification device may be arranged in a master controller or a converter controller of the wind turbine.

A fault processing device for a wind turbine is further provided according to an embodiment of the present disclosure. The fault processing device includes: a memory, a processor, and a program stored in the memory and executable on the processor. When executed by the processor, the program causes the processor to implement the fault processing method for a wind turbine described above.

There is further provided a computer-readable storage medium having stored thereon a program according to an embodiment of the present disclosure. When executed by the processor, the program causes the processor to implement the fault processing method for a wind turbine described above.

It should be noted that, each functional block shown in the above structural block diagrams may be implemented in hardware, software, firmware, or a combination thereof. When implemented in hardware, the functional block may be, for example, an electronic circuit, an application specific integrated circuit (ASIC), a suitable firmware, plug-in, function card, and the like. When implemented in software, the elements in the embodiments of the present disclosure are programs or code segments that are used to perform required tasks. The program or the code segments may be stored in a machine-readable medium or transmitted over a transmission medium or communication link through a data signal carried in the carrier. The "machine-readable medium" may include any medium that can store or transfer information. Examples of the machine-readable medium include an electronic circuit, a semiconductor memory device, a ROM, a flash memory, an erasable ROM (EROM), a floppy disk, a CD-ROM, an optical disk, a hard disk, a fiber optic medium, a radio frequency (RF) link, and the like. The code segments may be downloaded via a computer network such as the Internet and an intranet.

The foregoing shows only some specific embodiments of the present disclosure, but the protection scope of the present disclosure is not limited thereto. Those skilled in the art can easily think of changes or substitutions within the technical scope disclosed in the present disclosure. The changes or substitutions shall fall within the protection scope of the present disclosure. Therefore, the protection scope of the present disclosure shall be defined by the claims.

The invention claimed is:

1. A fault processing method for a wind turbine, comprising:
grouping faults of the wind turbine based on a predetermined target protection object, wherein the target protection object comprises a rotational speed or an insulated gate bipolar transistor (IGBT) temperature of a converter of the wind turbine, and each group of faults comprise a plurality of process faults associated with the target protection object and a target fault of the target protection object, wherein the target fault is an abnormal condition in which the target protection object exceeds a protection domain degree, and each of the plurality of process faults is an abnormal condition that is capable of causing the target protection object to exceed the protection domain degree;
performing a fault-tolerant control on the wind turbine, in a case that any one of the plurality of process faults in the same group as the target fault reaches a corresponding process fault trigger condition and the target fault does not reach a corresponding target fault trigger condition; and
selecting, in a case that the target fault reaches the corresponding target fault trigger condition, a process fault with the highest degree of correlation from triggered process faults in the same group as the target fault, as a real fault resulting in shutdown of the wind turbine.

2. The method according to claim 1, wherein the process fault with the highest degree of correlation comprises:
a process fault with the earliest trigger timing among the triggered process faults in the same group as the target fault; or
a process fault with the highest priority among the triggered process faults in the same group as the target fault, wherein the priority indicates a degree of impact of the process fault on the target fault.

3. The method according to claim 1, wherein after performing the fault-tolerant control on the wind turbine, the method further comprises:
adjusting one or more operating parameters of the wind turbine to restore the wind turbine to a state in which the process fault is not triggered.

4. The method according to claim 3, wherein the target protection object comprises a process fault associated with the IGBT temperature is that a temperature of water cooling liquid in the converter exceeds a preset threshold, and wherein
the adjusting one or more operating parameters of the wind turbine to restore the wind turbine to a state in which the process fault is not triggered comprises:
reducing output power of the wind turbine or the number of windings engaged in operation of the converter, to restore the temperature of water cooling liquid in the converter to a temperature lower than the preset threshold.

5. The method according to claim 1, wherein after performing the fault-tolerant control on the wind turbine, the method further comprises:
sending a warning message comprising information indicating that the process fault is triggered.

6. The method according to claim 1, wherein
the corresponding process fault trigger condition is reached in a case that sampling data related to the process fault meets first threshold information; and
the corresponding target fault trigger condition is not reached in a case that sampling data related to the target fault does not meet second threshold information.

7. The method according to claim 6, further comprising:
determining, in a case that sampling data for a same fault is from a plurality of sources, whether each of the sources of the sampling data is correct based on a value of the sampling data; and
selecting, in a case that two or more sources of the sampling data are correct, the sampling data from a source with a higher priority among the two or more sources as the sampling data related to the fault.

8. A fault processing device for a wind turbine, the fault processing device comprising:
a memory;
a processor; and
a program stored in the memory and executable on the processor, wherein
when executed by the processor, the program causes the processor to implement the fault processing method for a wind turbine according to claim 1.

9. A computer-readable storage medium having stored thereon a program, wherein when executed by a processor, the program causes the processor to implement the fault processing method for a wind turbine according to claim 1.

10. A fault processing device for a wind turbine, the fault processing device comprising:
a grouping module, configured to group faults of the wind turbine based on a target protection object, wherein the target protection object comprises a rotational speed or an insulated gate bipolar transistor (IGBT) temperature of a converter of the wind turbine, and each group of faults comprise a plurality of process faults associated with the target protection object and a target fault of the target protection object, wherein the target fault is an abnormal condition in which the target protection object exceeds a protection domain degree, and each of the plurality of process faults is an abnormal condition that is capable of causing the target protection object to exceed the protection domain degree;
a fault tolerance module, configured to perform a fault-tolerant control on the wind turbine, in a case that any one of the plurality of process faults in the same group as the target fault reaches a corresponding process fault trigger condition and the target fault does not reach a corresponding target fault trigger condition; and an identification module, configured to select, in a case that the target fault reaches the corresponding target fault trigger condition, a process fault with the highest degree of correlation from triggered process faults in the same group as the target fault, as a real fault resulting in shutdown of the wind turbine.

11. The device according to claim 10, further comprising:
an adjustment module, configured to adjust one or more operating parameters of the wind turbine to restore the wind turbine to a state in which the process fault is not triggered.

12. The device according to claim 11, wherein the process fault with the highest degree of correlation comprises:
a process fault with the earliest trigger timing among the triggered process faults in the same group as the target fault; or
a process fault with the highest priority among the triggered process faults in the same group as the target fault, wherein the priority indicates a degree of impact of the process fault on the target fault.

13. The device according to claim 12, wherein the device is arranged in a master controller or a converter controller of the wind turbine.

14. The device according to claim 10, wherein the process fault with the highest degree of correlation comprises:
a process fault with the earliest trigger timing among the triggered process faults in the same group as the target fault; or
a process fault with the highest priority among the triggered process faults in the same group as the target fault, wherein the priority indicates a degree of impact of the process fault on the target fault.

15. The device according to claim 14, wherein the device is arranged in a master controller or a converter controller of the wind turbine.

* * * * *